US012610809B2

(12) United States Patent
Chen et al.

(10) Patent No.: US 12,610,809 B2
(45) Date of Patent: Apr. 21, 2026

(54) INTERCONNECTION STRUCTURE LINED BY ISOLATION LAYER

(71) Applicant: Taiwan Semiconductor Manufacturing Co., Ltd., Hsin-Chu (TW)

(72) Inventors: Hsin-Liang Chen, Hsin-Chu (TW); Chun-Yen Yeh, Hsin-Chu (TW); Yu-Hsin Fang, Hsinchu City (TW); Han-Tang Lo, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 219 days.

(21) Appl. No.: 17/569,831

(22) Filed: Jan. 6, 2022

(65) Prior Publication Data

US 2022/0139833 A1 May 5, 2022

Related U.S. Application Data

(62) Division of application No. 16/045,546, filed on Jul. 25, 2018, now abandoned.

(Continued)

(51) Int. Cl.
| | |
|---|---|
| *H01L 23/528* | (2006.01) |
| *H01L 21/768* | (2006.01) |
| *H01L 23/532* | (2006.01) |

(52) U.S. Cl.
CPC ...... *H01L 23/5283* (2013.01); *H01L 21/7682* (2013.01); *H01L 23/5329* (2013.01); *H01L 21/76807* (2013.01); *H01L 21/76814* (2013.01); *H01L 21/76829* (2013.01); *H01L 21/76831* (2013.01); *H01L 21/7684* (2013.01); *H01L 21/76877* (2013.01)

(58) Field of Classification Search
CPC ............. H01L 23/5283; H01L 21/7682; H01L 21/76829; H01L 21/76807; H01L 21/76814; H01L 21/76831; H01L 21/7684; H01L 21/76877; H01L 23/5329
USPC ........................................................ 257/296
See application file for complete search history.

(56) References Cited

U.S. PATENT DOCUMENTS

| | | | | |
|---|---|---|---|---|
| 5,604,156 A | * | 2/1997 | Chung | .............. H01L 21/76843 |
| | | | | 257/E21.585 |
| 5,926,732 A | * | 7/1999 | Matsuura | ............ H01L 23/5329 |
| | | | | 438/700 |

(Continued)

OTHER PUBLICATIONS

Suñe et al. "Breakdown Modes and Breakdown Statistics of Ultrathin Si02 Gate Oxides" International Journal of High Speed Electronics and Systems, vol. 11, No. 3 (2001) 789-848, published in 2001.

*Primary Examiner* — Duy T Nguyen
(74) *Attorney, Agent, or Firm* — Eschweiler & Potashnik, LLC

(57) ABSTRACT

A semiconductor device includes: a first conductive structure that comprises a first portion having sidewalls and a bottom surface, wherein the first conductive structure is embedded in a first dielectric layer; and an isolation layer comprising a first portion and a second portion, wherein the first portion of the isolation layer lines the sidewalls of the first portion of the first conductive structure, and the second portion of the isolation layer lines at least a portion of the bottom surface of the first portion of the first conductive structure.

20 Claims, 12 Drawing Sheets

500

Related U.S. Application Data

(60) Provisional application No. 62/545,681, filed on Aug. 15, 2017.

(56) References Cited

U.S. PATENT DOCUMENTS

| | | | | |
|---|---|---|---|---|
| 6,249,055 B1 * | 6/2001 | Dubin | H01L 21/76831 | 257/E21.585 |
| 6,350,674 B1 * | 2/2002 | Okamura | H01L 21/31144 | 257/E21.252 |
| 6,455,417 B1 | 9/2002 | Bao | | |
| 6,506,680 B1 * | 1/2003 | Kim | H01L 21/76807 | 438/692 |
| 6,734,116 B2 | 5/2004 | Guo | | |
| 6,753,260 B1 * | 6/2004 | Li | H01L 21/31116 | 257/E21.252 |
| 6,803,314 B2 * | 10/2004 | Quek | H01L 21/76835 | 438/689 |
| 6,875,694 B1 | 4/2005 | Ngo | | |
| 7,135,402 B2 * | 11/2006 | Lin | H01L 21/76831 | 257/E21.584 |
| 7,605,085 B2 * | 10/2009 | Tomita | H01L 23/522 | 438/668 |
| 8,017,522 B2 * | 9/2011 | Lin | H01L 21/76805 | 257/E21.241 |
| 2002/0024139 A1 * | 2/2002 | Chan | H01L 21/76832 | 257/E21.576 |
| 2002/0140101 A1 | 10/2002 | Yang | | |
| 2002/0155700 A1 * | 10/2002 | Chen | H01L 21/76843 | 438/653 |
| 2003/0134521 A1 | 7/2003 | Guo | | |
| 2005/0133920 A1 * | 6/2005 | Liou | H01L 21/3122 | 438/723 |
| 2006/0166485 A1 | 7/2006 | Uglow | | |
| 2006/0170106 A1 | 8/2006 | Tseng | | |
| 2006/0175705 A1 * | 8/2006 | Tsutsue | H01L 23/53295 | 257/E21.576 |
| 2007/0117371 A1 | 5/2007 | Engbrecht | | |
| 2007/0243720 A1 | 10/2007 | Ko | | |
| 2008/0012142 A1 | 1/2008 | Mehta | | |
| 2009/0194845 A1 | 8/2009 | Werner | | |
| 2010/0200900 A1 * | 8/2010 | Iwayama | H10N 50/01 | 257/295 |
| 2010/0252930 A1 | 10/2010 | Liao | | |
| 2012/0326312 A1 | 12/2012 | JangJian | | |
| 2013/0049168 A1 * | 2/2013 | Yang | H01L 27/0629 | 257/E27.024 |
| 2015/0024588 A1 * | 1/2015 | Chen | H01L 21/76865 | 438/653 |
| 2016/0035675 A1 | 2/2016 | Hegde | | |
| 2017/0098759 A1 * | 4/2017 | Oh | H10N 50/80 | |
| 2019/0096820 A1 | 3/2019 | Liou | | |

* cited by examiner

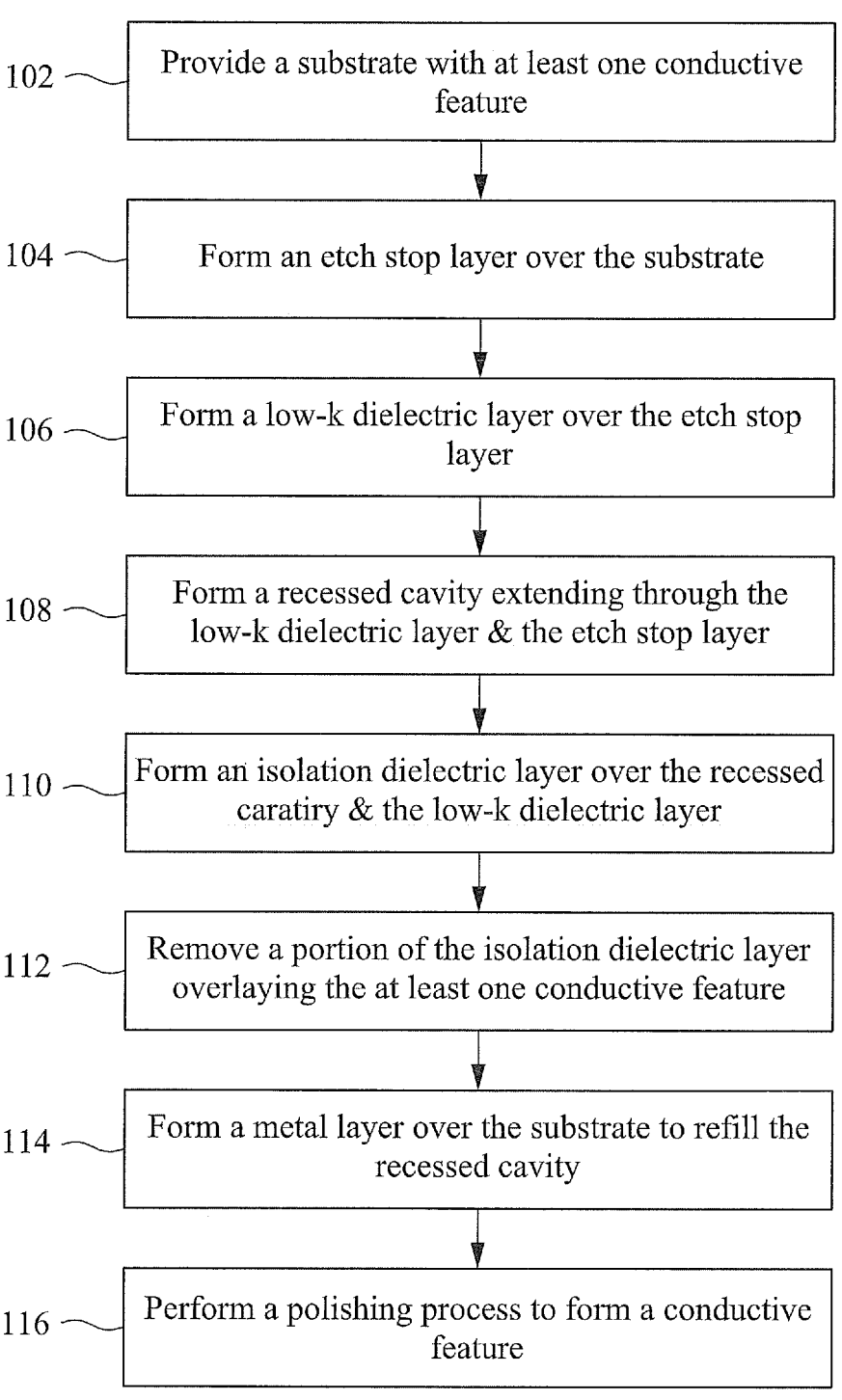

102 — Provide a substrate with at least one conductive feature

104 — Form an etch stop layer over the substrate

106 — Form a low-k dielectric layer over the etch stop layer

108 — Form a recessed cavity extending through the low-k dielectric layer & the etch stop layer 110 — Form an isolation dielectric layer over the recessed caratiry & the low-k dielectric layer 112 — Remove a portion of the isolation dielectric layer overlaying the at least one conductive feature 114 — Form a metal layer over the substrate to refill the recessed cavity 116 — Perform a polishing process to form a conductive feature

INTERCONNECTION STRUCTURE LINED BY ISOLATION LAYER

CROSS-REFERENCE TO RELATED APPLICATION

The present application is a divisional of U.S. patent application Ser. No. 16/045,546, filed on Jul. 25, 2018, which claims priority to U.S. Provisional Patent Application No. 62/545,681, filed on Aug. 15, 2017, each of which is incorporated by reference herein in its entirety.

BACKGROUND

The semiconductor industry has made significant advancements in its pursuit of higher device density with lower cost. In the course of semiconductor device evolution, functional density (for example, the number of interconnected conductive features per chip area) has generally increased while geometry sizes have decreased. This scaling down process generally provides benefits by increasing production efficiency and lowering associated costs.

However, the increased functional density has increased the complexity of semiconductor devices, for example, by decreasing the distance between adjacent conductive features. As such, an effect of parasitic coupling between the adjacent conductive features may become increasingly significant. Such an increasingly significant parasitic coupling effect between the adjacent conductive features typically results in a higher resistance-capacitance (RC) delay, which degrades the overall performance of the semiconductor devices.

To this end, a low-k dielectric material has been used to form the isolation layer to separate the adjacent conductive features because its low dielectric constant is useful in reducing the RC delay that is positively proportional to the dielectric constant. Accordingly, the lower the dielectric constant is, the lower the RC delay is. However, the low-k dielectric material is typically porous, which can be quantitated by a respective "porosity." In general, the lower the dielectric constant is, the higher the porosity is. It is understood that such a high porosity of the isolation layer can disadvantageously cause various issues such as, for example, less reliable isolation of the isolation layer, contamination on adjacent conductive feature(s), etc. In other words, a trade-off between the porosity (e.g., a corresponding isolation ability) and dielectric constant (e.g., a corresponding RC delay) of the isolation layer exists.

Therefore, conventional methods to isolate conductive features by isolation layers formed of low-k dielectric materials are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIG. 1 illustrates a flow chart of a method for forming a semiconductor device, in accordance with some embodiments.

DETAILED DESCRIPTION OF EXEMPLARY EMBODIMENTS

Figure 2A:
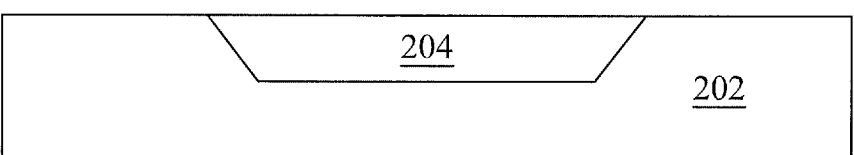
FIGS. 2A, 2B, 2C, 2D, 2E, 2F, 2G, and 2H illustrate cross-sectional views of a semiconductor device during various fabrication stages, made by the method of FIG. 1, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device having one or more conductive structures (or features) that are each embedded in a low-k dielectric material with an isolation dielectric layer coupled therebetween. Each of the conductive structures may serve as an interconnection structure of the semiconductor device that is configured to electrically couple to another structure/ feature/device. In accordance with some embodiments of the present disclosure, the isolation dielectric layer extends along the respective sidewalls of each of the conductive structures, and partially or fully extend along the respective lower boundary of each of the conductive structures. As such, when a plurality of conductive structures are to be formed over the semiconductor device, which typically arises various issues in conventional semiconductor devices, the disclosed isolation dielectric layer surrounding, at least part of, each of the conductive structures can eliminate the above-mentioned trade-off. For example, with the isolation dielectric layer at least partially surrounding the conductive structure, in addition to the low-k dielectric material, the isolation dielectric layer can further isolate the conductive structure from any adjacent conductive structure(s). Accordingly, the dielectric constant of the low-k dielectric material can be optimally minimized without concerning about the aforementioned porosity issue of the low-k dielectric material.

FIG. 1 illustrates a flowchart of a method 100 to form a semiconductor device, including one or more conductive structures at least partially surrounded by the disclosed isolation dielectric layer, according to one or more embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, and 2H, respectively, which will be discussed in further detail below.

Referring now to FIG. 1, the method 100 starts with operation 102 in which a substrate including at least one conductive feature is provided. The method 100 continues to operation 104 in which an etch stop layer is formed over the substrate. The method 100 continues to operation 106 in which a low-k dielectric layer is formed over the etch stop layer. The method 100 continues to operation 108 in which a recessed cavity extending through the low-k dielectric layer and etch stop layer is formed. In some embodiments, the recessed cavity is formed to expose at least a portion of an upper boundary of the conductive feature of the substrate, which will be discussed in further detail below. The method 100 continues to operation 110 in which an isolation dielectric layer is formed over the recessed cavity and the low-k dielectric layer. The method 100 continues to operation 112 in which a portion of the isolation dielectric layer, overlaying the at least one conductive feature, is removed. The method 100 continues to operation 114 in which a metal layer is formed over the substrate to refill the recessed cavity. The method 100 continues to operation 116 in which a polishing process is performed to form a conductive structure. According to some embodiments of the present disclosure, the conductive structure, at least partially surrounded by the isolation dielectric layer, is configured to electrically couple the conductive feature of the substrate to one or more other conductive structures. In particular, as mentioned above, such an isolation dielectric layer is formed to provide further isolation to the low-k dielectric layer to allow the dielectric constant of the low-k dielectric material to be optimally minimized without concerning about the porosity issue.

As mentioned above, FIGS. 2A-2H illustrate, in a cross-sectional view, a portion of a semiconductor device 200, including a conductive structure at least partially surrounded by the disclosed isolation dielectric layer, at various fabrication stages of the method 100 of FIG. 1. The semiconductor device 200 may be included in a microprocessor, memory cell, and/or other integrated circuit (IC). Also, FIGS. 2A-2H are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2H, for purposes of clarity of illustration.

Corresponding to operation 102 of FIG. 1, FIG. 2A is a cross-sectional view of the semiconductor device 200 including a bottom layer 202 with at least one conductive feature 204 at one of the various stages of fabrication, in accordance with some embodiments. Although the semiconductor device 200 in the illustrated embodiment of FIG. 2A includes only one conductive feature 204, it is understood that the illustrated embodiment of FIG. 2A and the following figures are merely provided for illustration purposes. Thus, the semiconductor device 200 may include any desired number of conductive features while remaining within the scope of the present disclosure.

In some embodiments, the bottom layer 202 represents a substrate, which includes a semiconductor material substrate, for example, silicon. Alternatively, the bottom layer 202 may include other elementary semiconductor material such as, for example, germanium. The bottom layer 202 may also include a compound semiconductor such as silicon carbide, gallium arsenic, indium arsenide, and indium phosphide. The bottom layer 202 may include an alloy semiconductor such as silicon germanium, silicon germanium carbide, gallium arsenic phosphide, and gallium indium phosphide. In one embodiment, the bottom layer 202 includes an epitaxial layer. For example, the substrate may have an epitaxial layer overlying a bulk semiconductor. Furthermore, the bottom layer 202 may include a semiconductor-on-insulator (SOD structure. For example, the substrate may include a buried oxide (BOX) layer formed by a process such as separation by implanted oxygen (SIMOX) or other suitable technique, such as wafer bonding and grinding.

In the above-described embodiment where the bottom layer 202 includes a semiconductor material, the conductive feature 204 may be a source, drain, or gate electrode of a transistor (e.g., a metal-oxide-semiconductor-field-effect-transistor (MOSFET)). Alternatively, the conductive feature 204 may be a salicide feature disposed on the source, the drain or the gate electrode. The silicide feature may be formed by a self-aligned salicide (typically known as "salicide") technique.

In some other embodiments, the bottom layer 202 represents a dielectric material layer formed over various device features (e.g., a source, drain, or gate electrode of a transistor), while the conductive feature 204 represents a metal feature (e.g., M1, the first level metal feature). Such a bottom layer 202 may include at least one of: silicon oxide, a comparatively low dielectric constant (k value) dielectric material with a k value less than about 4.0, or combinations thereof. In some embodiments, the bottom layer 202 is formed of a material, including a low-k dielectric material, an extreme low-k dielectric material, a porous low-k dielectric material, and a combination thereof. The term "low-k" is intended to define a dielectric constant of a dielectric material of 3.0 or less. The term "extreme low-k (ELK)" refers to a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed by some embodiments of the present disclosure such as, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material.

In such an embodiment where the bottom layer 202 is formed of a dielectric material, the conductive feature 204 may be a horizontal conductive structure, a vertical conductive structure, or a combination thereof formed within the bottom layer 202. For example, the conductive feature 204 may be an interconnection structure (i.e., a horizontal conductive structure), a via structure (i.e., a vertical conductive structure), or a combination thereof. Accordingly, the conductive feature 204 may be electrically coupled to a device feature of a transistor, for example, a source, drain, or gate feature of the transistor that is disposed below the tier, or interconnect level, where the bottom layer 202 is disposed. In such embodiments, the conductive feature 204 may be formed of a metal material (e.g., copper (Cu), aluminum (Al), tungsten (W), etc.).

Figure 2B:
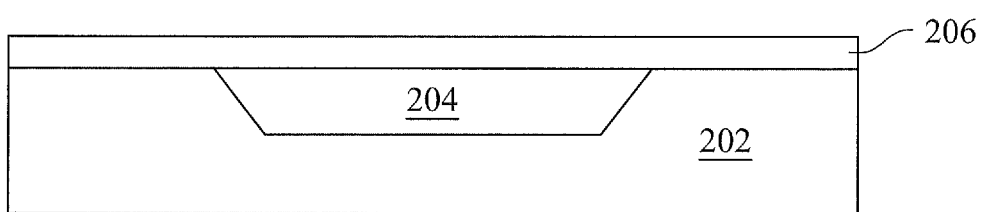

Corresponding to operation 104 of FIG. 1, FIG. 2B is a cross-sectional view of the semiconductor device 200 including an etch stop layer 206 at one of the various stages of fabrication, in accordance with some embodiments. As shown, the etch stop layer 206 is formed over the bottom layer 202 and the conductive feature 204.

In some embodiments, the etch stop layer 206 functions for controlling the end point during subsequent etching processes. In some embodiments, the etch stop layer 206 is formed of silicon oxide, silicon nitride, silicon carbide, silicon oxynitride or a combination thereof. In some embodiments, the etch stop layer 206 has a thickness of about 10 angstroms to about 1000 angstroms. The etch stop layer 206 is formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and current/future-developed deposition procedures.

Figure 2C:
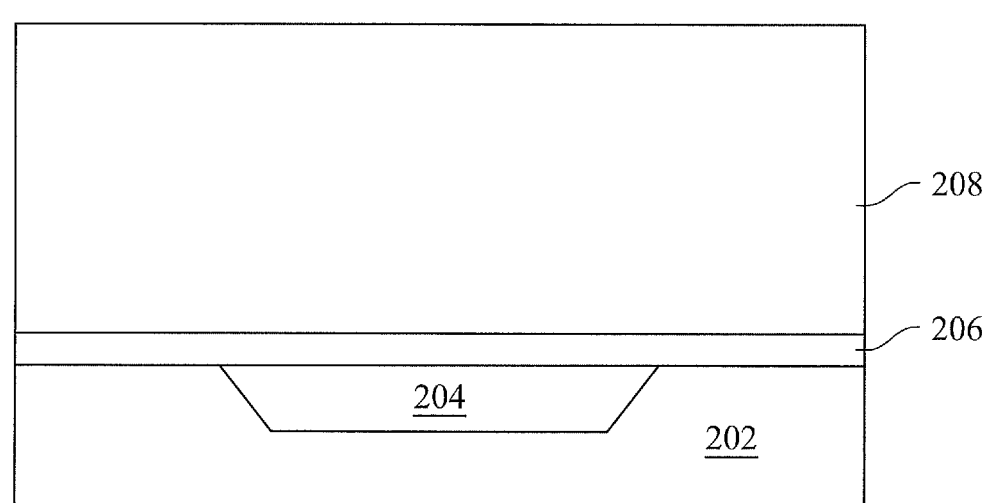

Corresponding to operation 106 of FIG. 1, FIG. 2C is a cross-sectional view of the semiconductor device 200 including a low-k dielectric layer 208 at one of the various stages of fabrication, in accordance with some embodiments. As shown, the low-k dielectric layer 208 is formed over the etch stop layer 206, which may be formed as a single-layer or a multi-layer structure. In some embodiments, the low-k dielectric layer 208 having a thickness varies with the applied technology, for example a thickness of about 1000 angstroms to about 30000 angstroms.

In some embodiments, the low-k dielectric layer 208 is formed of a material selected from the group consisting of: the above-described low-k dielectric material, extreme low-k dielectric material, porous low-k dielectric material, and a combination thereof. In some embodiments, the low-k dielectric layer 208 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the etch stop layer 206.

Figure 2D:
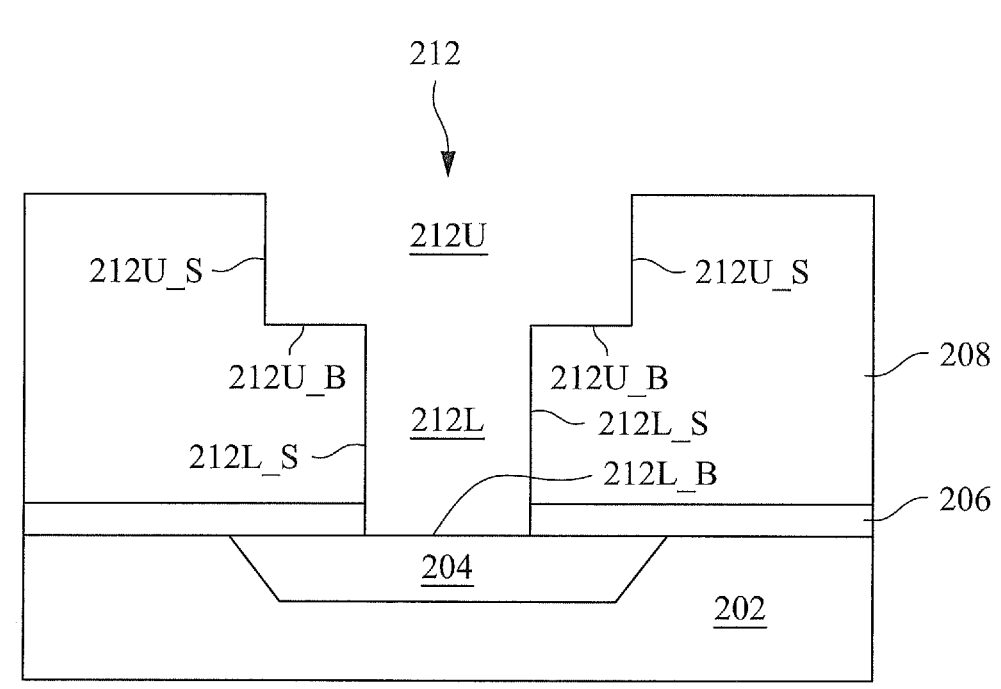

Corresponding to operation 108 of FIG. 1, FIG. 2D is a cross-sectional view of the semiconductor device 200 including a recessed cavity 212 at one of the various stages of fabrication, in accordance with some embodiments. As illustrated, the recessed cavity 212, which includes a lower via-hole section 212L and an upper trench section 212U, is formed to extend through the etch stop layer 206 and the low-k dielectric layer 208.

More specifically, in some embodiments, the upper trench section 212U has sidewalls 212U_S and bottom boundary 212U-B both defined by the low-k dielectric layer 208; and the lower via-hole section 212L has sidewalls 212L_S and bottom boundary 212L_B defined by the low-k dielectric layer 208 and exposes a portion of the upper boundary of the conductive feature 204, respectively. In some embodiments, the sidewalls 212L_S of the lower via-hole section 212L extends from the bottom boundary 212U_B of the upper trench section 212U along a direction (e.g., a substantially vertical direction) toward the bottom layer 202. As such, in some embodiments, after the formation of the recessed cavity 212, at least the portion of the upper boundary of the conductive feature 204, abutted by the bottom boundary 212L_B of the lower via-hole section 212L, is exposed.

It is noted that the recess cavity 212 is an exemplary dual damascene opening that is patterned in the etch stop layer 206 and the low-k dielectric layer 208 to define a contact region over the bottom layer 202. Although the embodiments of FIG. 2D (and the following figures) illustrate dual damascene opening in the low-k dielectric layer 208 (typically referred to as an inter-metal dielectric (IMD) layer), the use of single damascene opening in the IMD layer also provide values. In dual damascene techniques including a "via-first" patterning method or a "trench-first" patterning method, the upper trench section 212U and the lower via-hole section 212L may be formed using a typical lithographic with masking technologies and anisotropic etch operation (e.g. plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the low-k dielectric layer 208, providing a clear indicator of when to end a particular etching process.

Figure 2E:
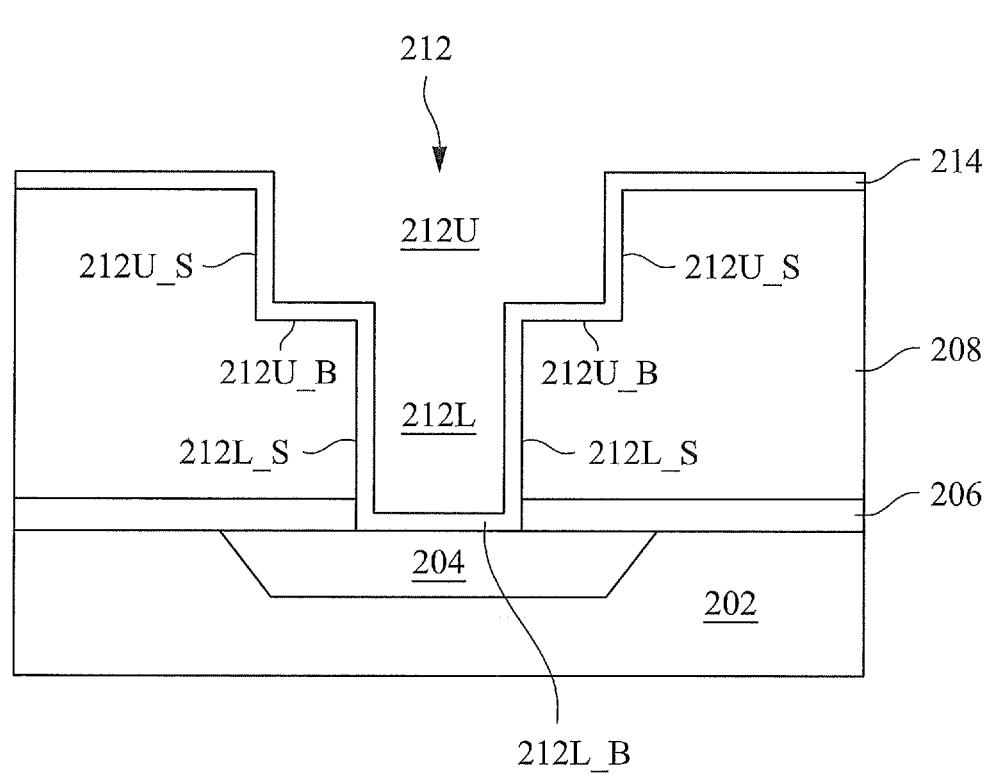

Corresponding to operation 110 of FIG. 1, FIG. 2E is a cross-sectional view of the semiconductor device 200 including an isolation dielectric layer 214 at one of the various stages of fabrication, in accordance with some embodiments. As shown, the isolation dielectric layer 214 is formed to overlay the low-k dielectric layer 208 and the recessed cavity 212 formed therein. More specifically, the isolation dielectric layer 214 overlays an upper boundary of the low-k dielectric layer 208; lines the sidewalls 212U_S and bottom boundary 212U_B of the upper trench section 212U; and lines the sidewalls 212L_S and bottom boundary 212L_B of the lower via-hole section 212L.

In some embodiments, the isolation dielectric layer 214 is formed of a non-conductive material selected from the group consisting of: silicon oxide, silicon nitride, silicon carbide, silicon oxynitride, and a combination thereof. In some embodiments, the isolation dielectric layer 214, which has a thickness of about 50 angstroms to about 300 angstroms, is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer lining the above-described boundaries/sidewalls.

Figure 2F:
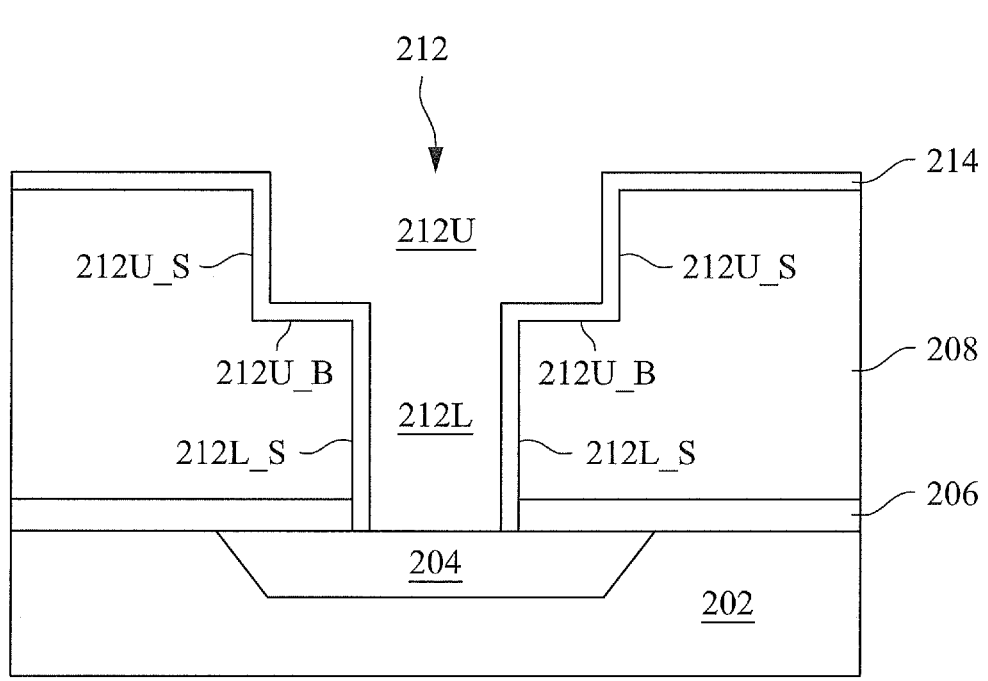

Corresponding to operation 112 of FIG. 1, FIG. 2F is a cross-sectional view of the semiconductor device 200 in which a portion of the isolation dielectric layer 214 is removed at one of the various stages of fabrication, in accordance with some embodiments. As shown, the portion of the isolation dielectric layer 214 that overlays the conductive feature 204 is removed such that the portion of the upper boundary of the conductive feature 204 is re-exposed. In some embodiments, an anisotropic etching process (e.g., a dry etching process) may be performed to re-expose the portion of the upper boundary of the conductive feature 204.

Figure 2G:
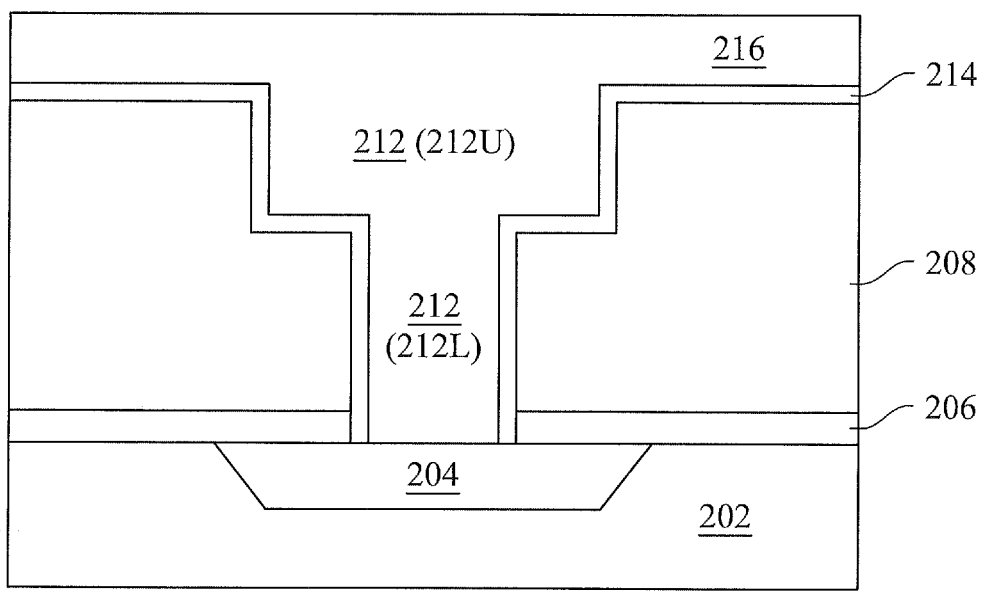

Corresponding to operation 114 of FIG. 1, FIG. 2G is a cross-sectional view of the semiconductor device 200 including a metal layer 216 at one of the various stages of fabrication, in accordance with some embodiments. As shown, the metal layer 216 is formed to overlay the isolation dielectric layer 214 and the re-exposed conductive feature 204 such that the lower via-hole section 212L and the upper trench section 212U of the recessed cavity 212 are respectively refilled by such a metal layer 216. In some embodiments, the metal layer 216 may be formed of a metal material (e.g., copper (Cu), aluminum (Al), tungsten (W), etc.). In some embodiments, the metal layer 216 is deposited through any of a variety of techniques, such as chemical vapor deposition (CVD), physical vapor deposition (PVD), E-gun, and/or other suitable techniques to overlay the isolation dielectric layer 214 and the re-exposed conductive feature 204 with at least one of the above-mentioned metal materials.

Figure 2H:
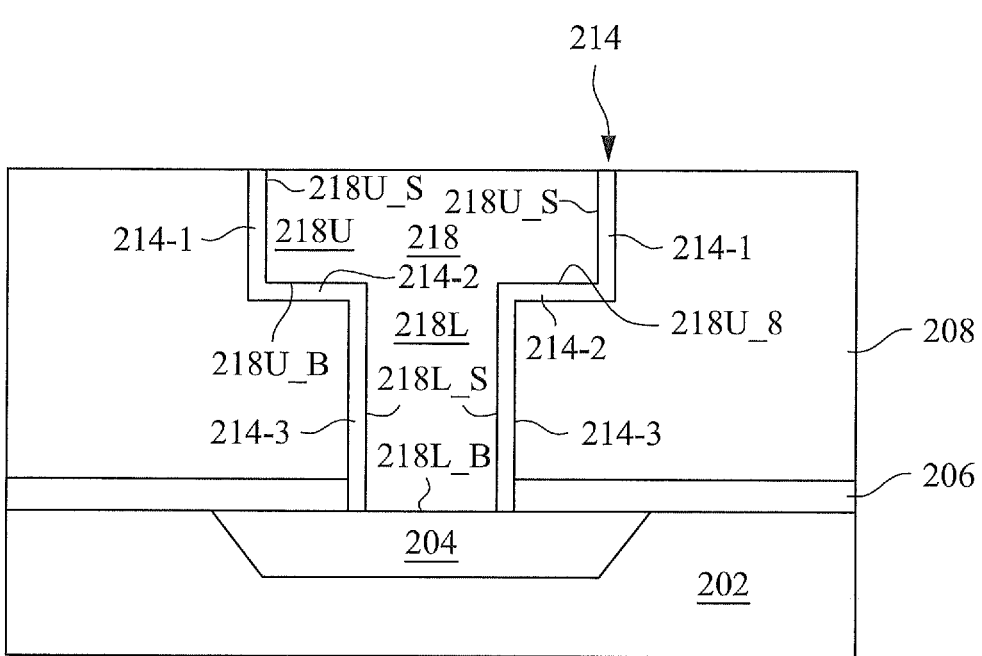

Corresponding to operation 116 of FIG. 1, FIG. 2H is a cross-sectional view of the semiconductor device 200 including a conductive structure 218 at one of the various stages of fabrication, in accordance with some embodiments. In some embodiments, the conductive structure 218 is formed after the portion of metal layer 216 (FIG. 2G) over the low-k dielectric layer 205 is removed. According to some embodiments, the conductive structure 218 may include two sections: an upper section 218U filling the upper trench section 212U (FIG. 2F) and a lower section 218L filling the lower via-hole section 212L (FIG. 2F).

More specifically, in some embodiments, the upper section 218U has sidewalls 218U_S and bottom boundary 218U_B both coupling the low-k dielectric layer 208 with respective portions (e.g., 214-1 and 214-2) of the isolation dielectric layer 214 disposed therebetween. And the lower section 218L has sidewalls 218L_S coupling the low-k dielectric layer 208 with respective portions (e.g., 214-3) of the isolation dielectric layer 214 disposed therebetween, and a bottom boundary 218L_B abutting the portion of the upper boundary of the conductive feature 204. In other words, the sidewalls 218U_S of the upper section 218U are each isolated from the low-k dielectric layer 208 by the portion 214-1 of the isolation dielectric layer 214 lining the sidewall 218U_S; the bottom boundary 218U_B of the upper section 218U is isolated from the low-k dielectric layer 208 by the portion 214-2 of the isolation dielectric layer 214 lining the bottom boundary 218U_B; and the sidewalls 218L_S of the lower section 218L are each isolated from the low-k dielectric layer 208 by the portion 214-3 of the isolation dielectric layer 214 lining the sidewall 218L_S. Further, in some embodiments, the sidewalls 218L_S of the lower section 218L extends from the bottom boundary 218U_B of the upper section 218U along a direction (e.g., a substantially vertical direction) toward the bottom layer 202.

In some embodiments, the removing process includes a chemical mechanical polishing (CMP) process performed to remove the excess portions of the metal layer 216 and the isolation dielectric layer 214 outside the recessed cavity 212 (FIG. 2G) (i.e., the portion of metal layer 216 extending beyond the sidewalls 212U_S), thereby exposing the upper boundary of the low-k dielectric layer 208 and achieving a planarized surface.

As identified above, when forming a plurality of conductive structures in a low-k dielectric layer, the trade-off between the porosity and dielectric constant of the low-k dielectric layer typically arises. However, with the disclosed isolation dielectric layer at least partially lining each of the conductive structures, the disclosed isolation dielectric layer can further isolate the conductive structures from any adjacent conductive structure(s). In other words, the low-k dielectric layer can suffer less stress from the conductive structures. Accordingly, the dielectric constant of the low-k dielectric layer can be optimally minimized (to improve the RC delay) without concerning about the porosity issue of the low-k dielectric layer.

Figure 3:
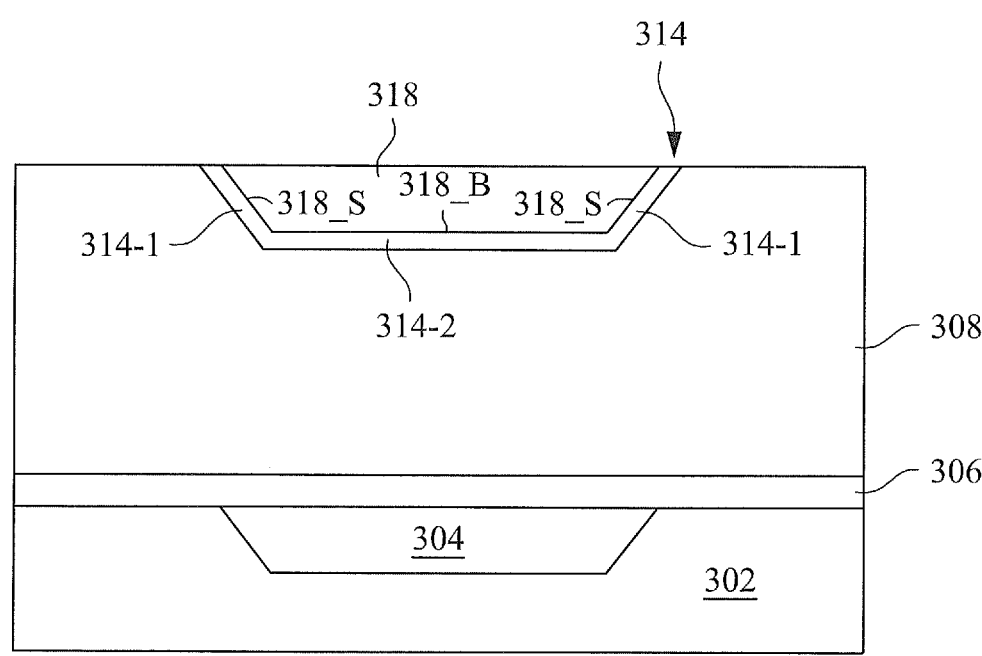
FIG. 3 illustrates a cross-sectional view of another semiconductor device during one fabrication stage, made by most of the operations of the method of FIG. 1, in accordance with some embodiments.

FIG. 3 illustrates a semiconductor device 300, made by most of the operations of the method 100 of FIG. 1, that is substantially similar to the semiconductor device 200, according to some embodiments of the present disclosure. For example, the semiconductor device 300 also includes a substrate 302, a conductive feature 304, an etch stop layer 306, a low-k dielectric layer 308, an isolation dielectric layer 314, and a conductive structure 318, which are substantially similar to the bottom layer 202, the conductive feature 204, the etch stop layer 206, the low-k dielectric layer 208, the isolation dielectric layer 214, and the conductive structure 318, respectively. It is, however, noted that in the illustrated embodiment of FIG. 3 the conductive structure 318 does not have a lower section (e.g., 218L of FIG. 2H).

Accordingly, the conductive structure 318 has sidewalls 318_S and bottom boundary 318_B both coupling the low-k dielectric layer 308 with respective portions (e.g., 314-1 and 314-2) of the isolation dielectric layer 314 disposed therebetween. In other words, the sidewalls 318_S of the conductive structure 318 are each isolated from the low-k dielectric layer 308 by the portion 314-1 of the isolation dielectric layer 314 lining the sidewall 318_S; and the bottom boundary 318_B of the conductive structure 318 is isolated from the low-k dielectric layer 308 by the portion 314-2 of the isolation dielectric layer 314 lining the bottom boundary 318_B.

In some embodiments, such a conductive structure 318 can still be made by the operations of the method 100 of FIG. 1 except that in operation 108, the recessed cavity may be formed to have only the trench section, which may be a single damascene technique or part of the dual damascene technique, and operation 112 may become optional.

Figure 4:
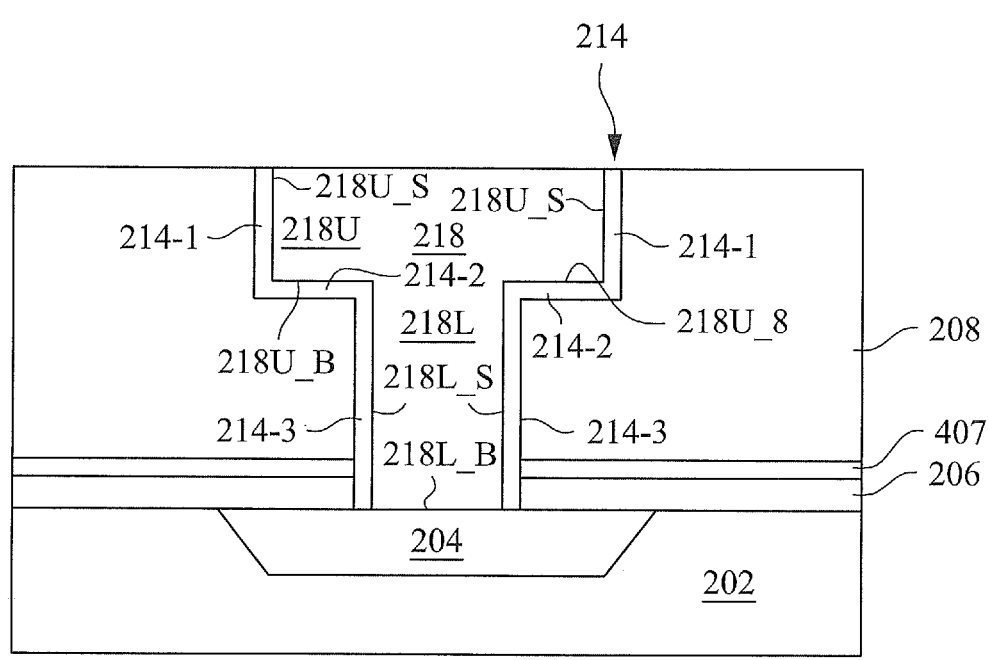
FIG. 4 illustrates a cross-sectional view of another semiconductor device, in accordance with some embodiments.

FIG. 4 illustrates a cross-sectional view of another semiconductor device 400, in accordance with some embodiments. The semiconductor device 400 has the same structure as that of the semiconductor device 200 shown in FIG. 2H, except that the semiconductor device 400 has an interlayer 407 that is formed on the etch stop layer 206 and below the low-k dielectric layer 208. In one embodiment, the interlayer 407 comprises tetraethyl orthosilicate (TEOS). In one embodiment, the interlayer 407 has a thickness less than that of the etch stop layer 206.

Figure 5:
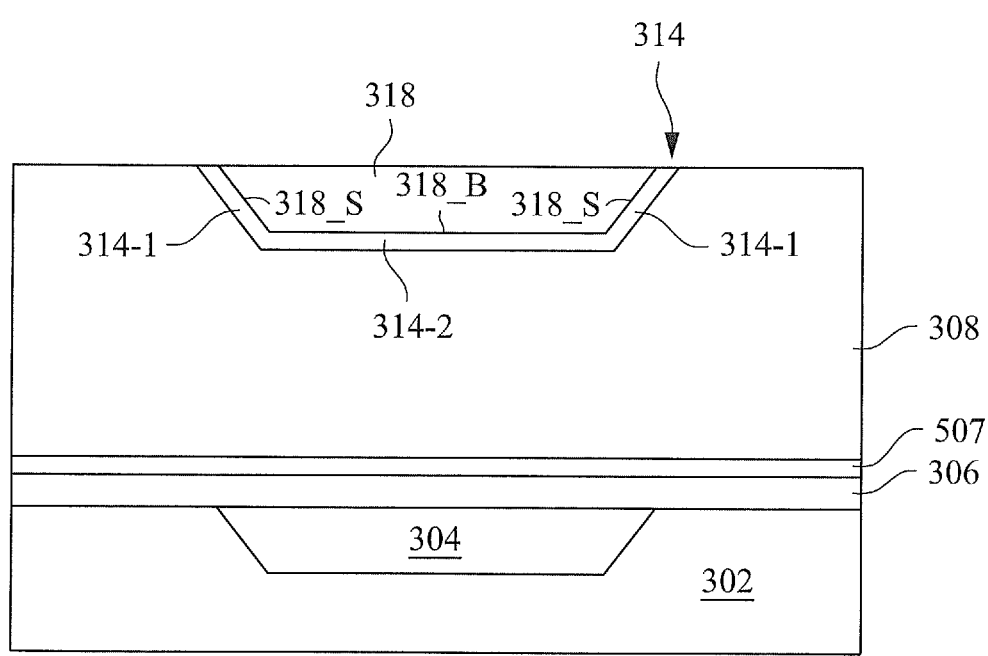
FIG. 5 illustrates a cross-sectional view of yet another semiconductor device, in accordance with some embodiments.

FIG. 5 illustrates a cross-sectional view of yet another semiconductor device 500, in accordance with some embodiments. The semiconductor device 500 has the same structure as that of the semiconductor device 300 shown in FIG. 3, except that the semiconductor device 500 has an interlayer 507 that is formed on the etch stop layer 306 and below the low-k dielectric layer 308. In one embodiment, the interlayer 507 comprises tetraethyl orthosilicate (TEOS). In one embodiment, the interlayer 507 has a thickness less than that of the etch stop layer 306.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a semiconductor device includes: a first conductive structure that comprises a first portion having sidewalls and a bottom surface, wherein the first conductive structure is embedded in a first dielectric layer, and an isolation layer comprising a first portion and a second portion, wherein the first portion of the isolation layer lines the sidewalls of the first portion of the first conductive structure, and the second portion of the isolation layer lines at least a portion of the bottom surface of the first portion of the first conductive structure.

In another embodiment, a semiconductor device includes: a first conductive structure having sidewalls and a bottom surface, wherein the first conductive structure is embedded in a first dielectric layer; and an isolation layer comprising a first portion and a second portion, wherein the first portion of the isolation layer lines sidewalls of the first conductive structure, and the second portion of the isolation layer lines the bottom surface of the first conductive structure.

In yet another embodiment, a semiconductor device includes: a first conductive structure that comprises a first portion having sidewalls and a bottom surface, wherein the first conductive structure is embedded in a first dielectric layer; and a first isolation layer comprising a first portion and a second portion, wherein the first portion of the first isolation layer lines sidewalls of the first portion of the first conductive structure, and the second portion of the first isolation layer, extending from the first portion, lines a first portion of the bottom surface of the first portion of the first conductive structure.

What is claimed is:

1. A semiconductor device, comprising:
an etch stop layer;
an interlayer overlying and contacting the etch stop layer;
a first dielectric layer overlying and contacting the interlayer;
a first conductive structure including a top surface, sidewalls, and a bottom surface, wherein a first angle between at least one of the sidewalls and the bottom surface is a first obtuse angle, and a second angle between the at least one of the sidewalls and the top surface is an acute angle, and wherein the first conductive structure is embedded in the first dielectric layer;
an isolation layer comprising a first portion and a second portion, wherein the first portion of the isolation layer is in direct contact with a first entirety of the sidewalls of the first conductive structure, and the second portion of the isolation layer is in direct contact with a second entirety of the bottom surface of the first conductive structure, such that a third angle between the first portion of the isolation layer and the second portion of the isolation layer is a second obtuse angle; and
a second conductive structure in a bottom layer, wherein the second conductive structure and the bottom layer underlie and contact the etch stop layer, wherein the isolation layer is electrically non-conductive and comprises multiple different dielectric materials, wherein the isolation layer overlies and is spaced from the second conductive structure, the bottom layer, the etch stop layer, and the interlayer in a cross-sectional plane, and wherein the first dielectric layer comprises a low-k dielectric material continuously from the interlayer to a top surface of the isolation layer.

2. The semiconductor device of claim 1, wherein the second conductive structure is isolated from the first conductive structure by at least the isolation layer.

3. The semiconductor device of claim 1, wherein the second conductive structure is isolated from the first conductive structure by both the isolation layer and the first dielectric layer.

4. The semiconductor device of claim 1, wherein the second conductive structure is isolated from the first conductive structure by: the isolation layer, the first dielectric layer, the interlayer, and the etch stop layer.

5. The semiconductor device of claim 1, wherein:
the second conductive structure comprises one of a source, drain, or gate electrode of a transistor.

6. The semiconductor device of claim 1, wherein: the second conductive structure comprises a salicide feature disposed on a source, drain, or gate electrode of a transistor.

7. The semiconductor device of claim 1, wherein each of the first conductive structure and the second conductive structure has a shape of a trapezoid.

8. The semiconductor device of claim 1, wherein:
the isolation layer has a thickness between 50 angstroms and 300 angstroms; and
the first dielectric layer has a thickness between 1000 and 30000 angstroms.

9. The semiconductor device of claim 1, wherein the sidewalls of the first conductive structure are coupled to the first dielectric layer with the first portion of the isolation layer disposed therebetween.

10. The semiconductor device of claim 1, wherein the bottom surface of the first conductive structure is coupled to the first dielectric layer with the second portion of the isolation layer disposed therebetween.

11. The semiconductor device according to claim 1, wherein the multiple different dielectric materials are selected from a group of dielectric materials consisting of silicon oxide, silicon nitride, silicon carbide, and silicon oxynitride.

12. A semiconductor device, comprising:
an etch stop layer;
an interlayer that overlies the etch stop layer and has a thickness less than that of the etch stop layer;
a first dielectric layer that overlies the interlayer;
a first conductive structure having a top surface, sidewalls, and a bottom surface, wherein the first conductive structure is embedded in the first dielectric layer;
a first isolation layer comprising a first portion and a second portion, wherein the first portion of the first isolation layer is in direct contact with a first entirety of the sidewalls of the first conductive structure, and the second portion of the first isolation layer is in direct contact with a second entirety of the bottom surface of the first conductive structure; and
a second conductive structure in a bottom layer, wherein the second conductive structure and the bottom layer underlie and contact the etch stop layer, wherein the first isolation layer is electrically non-conductive and comprises multiple different dielectric materials, wherein the first isolation layer overlies and is spaced from the second conductive structure, the bottom layer, the etch stop layer, and the interlayer in a cross-sectional plane, and wherein the bottom layer, the etch stop layer, the interlayer, and the first dielectric layer share a common width in the cross-sectional plane.

13. The semiconductor device of claim 12, wherein the second conductive structure is isolated from the first conductive structure by at least the first isolation layer.

14. The semiconductor device of claim 13, wherein the second conductive structure is isolated from the first conductive structure by both the first isolation layer and the first dielectric layer.

15. The semiconductor device of claim 13, wherein the second conductive structure is isolated from the first conductive structure by: the first isolation layer, the first dielectric layer, the interlayer, and the etch stop layer.

16. The semiconductor device according to claim 13, wherein the second conductive structure is devoid of an isolation layer lining sidewalls of the second conductive structure and a bottom surface of the second conductive structure in the cross-sectional plane, such that the sidewalls of the second conductive structure and the bottom surface of the second conductive structure entirely contact the bottom layer in the cross-sectional plane, and wherein the bottom layer and the first dielectric layer are low-k dielectrics.

17. The semiconductor device according to claim 13, wherein the etch stop layer overlies and contacts the second conductive structure, the interlayer overlies and contacts the etch stop layer, and the first dielectric layer overlies and contacts the interlayer, and wherein the first dielectric layer comprises a low-k dielectric material continuously from the interlayer to a top surface of the first isolation layer.

18. A semiconductor device, comprising:
an etch stop layer;
an interlayer overlying and contacting the etch stop layer;
a first dielectric layer overlying and contacting the inter-layer;
a first conductive structure including a top surface, side-walls, and a bottom surface, wherein:
the first conductive structure is embedded in the first dielectric layer, and
a first angle between at least one of the sidewalls and the bottom surface is a first obtuse angle, and a second angle between the at least one of the side-walls and the top surface is an acute angle;
an isolation layer that is electrically non-conductive and that comprises a first portion and a second portion, wherein the first portion of the isolation layer is in direct contact with a first entirety of the sidewalls of the first conductive structure in a cross-sectional plane, and the second portion of the isolation layer is in direct contact with a second entirety of the bottom surface of the first conductive structure in the cross-sectional plane, such that a third angle between the first portion of the isolation layer and the second portion of the isolation layer is a second obtuse angle; and
a second conductive structure in a bottom layer, wherein the second conductive structure and the bottom layer underlie and contact the etch stop layer, wherein the second conductive structure is devoid of an isolation layer lining sidewalls of the second conductive struc-ture and a bottom surface of the second conductive structure in the cross-sectional plane, such that the sidewalls of the second conductive structure and the bottom surface of the second conductive structure entirely contact the bottom layer in the cross-sectional plane, and wherein the bottom layer and the first dielectric layer are low-k dielectrics.

19. The semiconductor device of claim 18, wherein the second conductive structure is isolated from the first con-ductive structure by: the isolation layer, the first dielectric layer, the interlayer, and the etch stop layer.

20. The semiconductor device of claim 18, wherein the etch stop layer is silicon oxide and the first dielectric layer is a low-k dielectric material continuously from the inter-layer to an elevation common to a top surface of the isolation layer and the top surface of the first conductive structure.

* * * * *